United States Patent [19]

Nakano et al.

[11] Patent Number: 5,221,575
[45] Date of Patent: Jun. 22, 1993

[54] THERMALLY CONDUCTIVE SHEET

[75] Inventors: Akio Nakano; Nobumasa Tomizawa, both of Gunma, Japan

[73] Assignee: Shin-Etsu Chemical Co. Ltd., Tokyo, Japan

[21] Appl. No.: 784,341

[22] Filed: Oct. 29, 1991

[30] Foreign Application Priority Data

Oct. 30, 1990 [JP] Japan ................... 2-114374

[51] Int. Cl.$^5$ .............. B32B 15/06; B32B 15/18; B32B 15/20
[52] U.S. Cl. ................... 428/323; 428/337; 428/450
[58] Field of Search ............. 428/450, 457, 220, 323, 428/337

[56] References Cited

U.S. PATENT DOCUMENTS 5,070,597 12/1991 Holt et al. ................... 428/35.7

Primary Examiner—Paul J. Thibodeau
Assistant Examiner—D. S. Nakarani
Attorney, Agent, or Firm—Millen, White, Zelano & Branigan

[57] ABSTRACT

A thermally conductive sheet comprising a metal foil of which at least one side is coated with a graphite powder-containing silicone rubber layer to gain improved thermally conductive efficiency without attended by decrease in thermal conductivity with time and increase in production cost, and further to enable the enhancement of adhesiveness to other materials by easy incorporation of organopolysiloxanes of adhesion-conferring type into the silicone rubber layer, thus showing excellent aptitude for a thermally conductive sheet of full pack mold transistors.

13 Claims, 2 Drawing Sheets

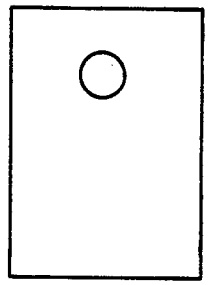
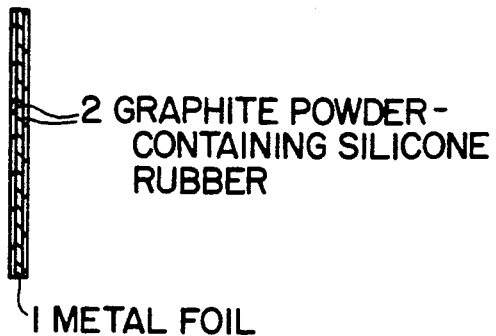
FIG. 3a          FIG. 3b
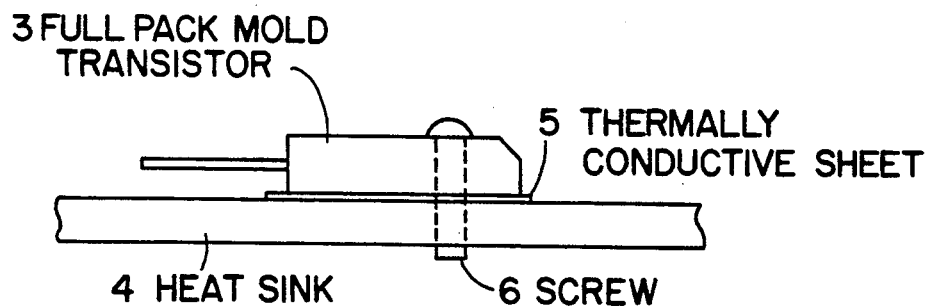
FIG. 4

THERMALLY CONDUCTIVE SHEET

FIELD OF THE INVENTION

This invention concerns a thermally conductive sheet, and in particular, a thermally conductive sheet suitable as a thermally conductive sheet for full pack mold transistors.

BACKGROUND OF THE INVENTION

Conventionally, when electronic components which emit heat such as transistors and diodes were installed, thermally conductive grease was applied between heat sinks and the metal chassis in order to confer insulating or thermally conducting properties. The application of this grease however required a complicated procedure, and as it is also tended to cause soiling, electrical insulating sheets with good thermally conductive properties subsequently came into use.

With the recent generalization of insulating type full pack mold transistors wherein the whole of the electronic device is sealed in by an epoxy resin, thermally conductive sheets have now come to replace electrical insulating sheets with thermally conductive properties. This is due to the fact that, as electronic components which emit heat are now full pack molded, insulating properties are no longer necessary and thermally conductive properties are an important factor to be considered.

Conventional thermally conductive sheets use rubber or plastic as binders with metal powders or inorganic powders with good thermally conductive properties as fillers.

Examples of inorganic powders with good thermally conductive properties are alumina (thermal conductivity: 0.074 cal/cm.sec. °C.), boron nitride (thermal conductivity: 0.15 cal/cm.sec. °C.), magnesium oxide (thermal conductivity: 0.12 cal/cm.sec. °C.), and silicon carbide (thermal conductivity: 0.22 cal/cm.sec. °C.), but these materials suffered from the disadvantage of having poorer thermal conductivity than that of metal powders.

Examples of metal powders are aluminum (thermal conductivity: 0.57 cal/cm.sec. °C.), copper (thermal conductivity: 0.95 cal/cm.sec. °C.) and silver (thermal conductivity: 1.02 cal/cm.sec. °C.). Aluminum and copper are however easily oxidized, and although silver is not an easily oxidizable metal, it suffers from the disadvantage of very high cost.

In recent years, a high thermally conductive sheet using a powder or short strands of aluminum or copper metal (Japanese Patent Laid-Open (KOKAI) No. 58-163623) and a thermally conductive sheet consisting of a graphite sheet coated on either one or both sides with a silicone rubber (Japanese Patent Laid-Open (KOKAI) No. 62-25440) have been proposed. In the former case, however, thermal conductivity decreased with time due to oxidation of the metal powder and the strength of the sheet was unsatisfactory. In the latter case, thermal conductivity was high and did not decrease with time, however the graphite sheet was costly and the cost of manufacturing it was high.

Further, conventional thermally conductive sheets have no adhesive properties, so when transistors were fitted to heat sinks or other components, a positional maladjustment easily occurred between the thermally conductive sheet and the transistor. The correct setting of components was thus an extremely troublesome operation.

The inventors of the present invention carried out extensive studies to resolve the aforesaid disadvantages.

As a result, it has been found that by providing a silicone rubber layer containing graphite powder (thermal conductivity 0.31 cal/cm.sec. °C.) on one or both sides of a metal foil, a low cost thermally conductive sheet can be obtained having far superior thermal conductivity compared to conventional thermally conductive sheets using inorganic powders, and that this thermally conductive sheet can prevent a decrease of thermal conductivity with time due to oxidation as occurred with thermally conductive sheets using metal powders. Also, it has been found that by adding an adhesion-conferring organopolysiloxane to the silicone rubber in order to improve the contact between the transistor and the heat sink, the stability of the assembly can be improved, and a thermally conductive sheet with improved thermal conductive properties can be obtained even when there are scratches or marks on the transistor.

SUMMARY OF THE INVENTION

It is therefore an object of the present invention to provide a low cost thermally conductive sheet having superior thermally conductive properties which does not suffer a decrease of thermally conductive properties with time, and which is therefore suitable for use as a thermally conductive sheet for full pack mold transistors.

It is a further object of the present invention to provide a thermally conductive sheet for use with full pack mold transistors having good contact between the transistor and the heat sink, improved assembly stability and improved thermally conductive properties.

The aforementioned objects of the invention are achieved by a thermally conductive sheet characterized in that it comprises a silicone rubber layer (2) containing graphite powder on at least one side of a metal foil (1).

The thermally conductive sheet of the present invention uses a graphite powder as an agent to confer thermally conductive properties.

It therefore has far superior thermally conductive properties than a conventional sheet using inorganic powder, it can be manufactured for relatively low cost, and as there is no oxidation of metal powder, there is no decrease of thermally conductive properties with time.

Further, if adhesive properties are conferred on the graphite powder-containing silicone rubber layer, not only is the stability of the transistor assembly improved, but contact is improved and thermally conductive performance is much improved as compared to the conventional case even if there are scratches or marks on the transistor.

Further, as the sheet is reinforced by the metal foil, it is not damaged when it is installed.

BRIEF DESCRIPTION OF DRAWINGS

FIG. 3(a) is front view, and (b) a lateral view, of the case where the thermally conductive sheet of the present invention is fabricated as a thermally conductive sheet of transistor.

FIG. 4 is a lateral view showing the way in which the thermally conductive sheet of the present invention is used for installing a full pack mold transistor.

DETAILED DESCRIPTION OF THE INVENTION

The present invention will now be described in detail with reference to the drawings, but it should be understood that the invention is not to be interpreted as being limited in any way by this description.

Figure 1:
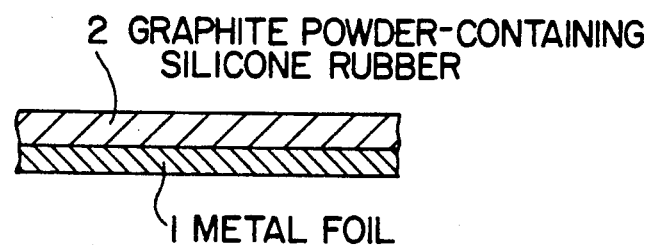
FIG. 1 is a sectional view illustrating the thermally conductive sheet according to the present invention wherein a graphite powder-containing silicone rubber layer is provided on one side of a metal foil.

FIG. 1 is a sectional view illustrating a thermally conductive sheet of the present invention having a graphite powder-containing silicone rubber layer on one side of a metal foil.

Figure 2:
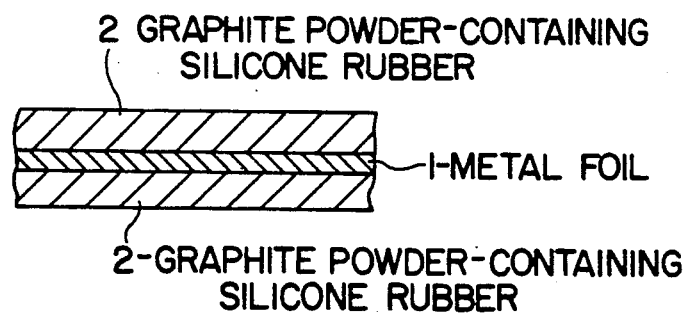
FIG. 2 is a sectional view illustrating the thermally conductive sheet according to the present invention wherein a graphite powder-containing silicone rubber layer is provided on both sides of a metal foil.

FIG. 2 is a sectional view illustrating a thermally conductive sheet of the present invention having a graphite powder-containing silicone rubber layer on both sides of a metal foil.

FIG. 3(a) and (b) are front and lateral views illustrating one example wherein the thermally conductive sheet of the present invention has been fabricated as thermally conductive sheet of a transistor.

FIG. 4 is a lateral view illustrating the way in which the thermally conductive sheet of the present invention is used for installing a full pack transistor.

The metal foil (1) of the present invention may be suitably chosen from metals such as aluminum, copper, iron, nickel, tin or zinc, or alloys such as stainless steel, brass or monel. Further, the thickness of the metal foil used is preferably in the range 1 $\mu$m–300 $\mu$m. If the thickness is less than 1 $\mu$m, the foil has insufficient strength, while if it is greater than 300 $\mu$m, machining problems arise.

The graphite powder-containing silicone rubber layer (2) of the thermally conductive sheet of the present invention should preferably contain 60–400 parts by weight of graphite powder added to 100 parts by weight of silicone rubber. If the proportion of graphite powder is less than 60 parts by weight, thermally conductive properties are somewhat poorer, while if it is greater than 400 parts by weight, the rubber layer becomes brittle.

The graphite used in the present invention may be suitably chosen from natural graphites such as crystalline graphite of which the external appearance is flaky, lamellar or needle-like, and earthy graphite (amorphous graphite) of which the external appearance is earthy or lumpy, or synthetic graphites obtained by heat treatment of petroleum or coal type pitch coke at 2,000°–3,000° C. The particle size of the graphite should however preferably be within the range 0.1–100 $\mu$m, and more preferably within the range 1–50 $\mu$m. If the particle size is less than 0.1 $\mu$m, high packing is not possible so that the specified thermally conductive properties are not obtained. If the particle size is greater than 100 $\mu$m, on the other hand, the rubber layer becomes brittle and surface smoothness is impaired. The particles may be flaky, lumpy or spherical, and there is no particular limitation on their shape.

The silicone rubber of the present invention may be any organopolysiloxane represented by the general formula $R_aSiO_{(4-a)/2}$ (where R is an organic group such as methyl, vinyl, phenyl or trifluoropropyl, and a is a number in the range 1.98–2.02). These compounds may be in an oily state or raw rubber state, but it is particularly preferable that their viscosity is at least 1,000 cs at 25° C.

The graphite powder-containing silicone rubber layer (2) of this invention may if necessary be blended with reinforcing silicas such as silica hydrogels or silica aerogels, heat resistance-improving agents such as titanium oxide or cerium oxide, or inorganic fillers such as quartz powder or diatomaceous earth.

The silicone rubber curing agent may be suitably chosen from any of the substances known in the art. Those that function by a radical reaction include organic peroxides such as di-t-butyl peroxide or 2,5-dimethyl-2,5-di(t-butylperoxy)hexane; those that function by an addition reaction include substances comprising an organohydrogenpolysiloxane having at least two hydrogen atoms bonded to a silicon atom in one molecule and a platinum catalyst.

If in this invention it is also desired to confer adhesive properties on the graphite powder-containing silicone rubber layer (2), an organopolysiloxane (adhesion-conferring organopolysiloxane) wherein the mole ratio of $SiO_2$ units to $R'_3SiO_{0.5}$ units in the molecule (where R' is a hydrogen atom or an organic group such as methyl, vinyl or phenyl) is equal to 1:0.4–1:1.5, may be added. If the mole ratio of $R'_3SiO_{0.5}$ units is less than 0.4 the molecule has poor stability in storage, while if it is greater than 1.5 adhesive properties are impaired.

If 10–50 parts by weight per 100 parts by weight of silicone rubber in the graphite powder-containing silicone rubber layer (2) are replaced by the aforesaid adhesion-conferring organopolysiloxane, adhesive properties can be easily conferred on the graphite powder-containing silicone rubber layer (2). If the proportion of the organopolysiloxane is less than 10 parts by weight, adhesion properties are inadequate, while if it is greater than 50 parts by weight, the graphite powder-containing silicone rubber layer (2) becomes brittle.

An example of a method of fabricating the thermally conductive sheet of the present invention will now be described in detail.

Firstly, 60–400 parts by weight of graphite powder are added to 100 parts by weight of silicone rubber. The addition may be made by means of a gate mixer or the like when the silicone rubber is in liquid form, or a two-rod roller, kneader or the like when it is in raw rubber form.

Further, when a large amount of graphite is to be added, the silicone rubber may first be dissolved in an organic solvent such as toluene, xylene or hexane before adding the graphite.

Next, either one or both sides of a metal foil (1) of any desired size is coated with said graphite-containing silicone rubber by means of a calender or coating implement. In this procedure, to improve the adhesion between the metal foil (1) and graphite powder-containing silicone rubber, a silicone rubber primer commonly used for metal foil may first be applied, or alternatively a silane coupling agent may first be blended with the graphite powder-containing silicone rubber to confer self-adhesive properties upon it.

In using the coating procedure, the graphite powder-containing silicone rubber may be dissolved to a specified concentration in an organic solvent such as toluene, xylene or hexane to prepare a coating solution, applied to the metal foil (1) by means of an air doctor coater, blade coater, knife coater or the like, and then weighed.

Alternatively, it may be weighed before being applied by a reverse roller coater, gravure coater, spray coater or the like.

When the graphite powder-containing silicone rubber layer (2) is to be cured, it is normally heated to a temperature of 120°-300° C. for 1-30 minutes depending on the thickness of the layer and type of curing agent.

Finally, the sheet is cut out to fit the shape of the transistor as shown in FIG. 3 in order to obtain the thermally conductive sheet of the present invention.

The thermally conductive sheet (5) of the present invention may for example be interposed between a full pack mold transistor (3) and heat sink (4) as shown in FIG. 4.

It is generally used in applications where insulating properties are not required, and high thermal conduction is required. In the case of FIG. 4, the thermally conductive sheet (5) of the present invention is fixed by a screw (6), and it is therefore provided with a hole to permit the passage of this screw (6) as shown in FIG. 3(a).

When the transistor is not to be fixed by means of a screw, a thermally conductive sheet without such a hole may be used.

EXAMPLES

The thermally conductive sheet of the present invention will now be described in detail with reference to specific examples, but it should be understood that the invention is not to be interpreted as being limited in any way by these examples.

EXAMPLE 1

250 parts by weight of graphite powder of average particle size 10 μm (commercial name POG-10: Shin-Etsu Chemical Co., Ltd.) was blended with 100 parts by weight of an organopolysiloxane comprising 99.85 mole % of dimethylsiloxane and 0.15 mole % of methylvinylsiloxane of average degree of polymerization 8,000 using a two-rod roller, 1 part by weight of 2,5-dimethyl-2,5-di(t-butylperoxy)hexane was added as curing agent, 150 parts by weight of toluene was added, and a coating solution prepared using a homomixer.

Next, both sides of a 50 μm aluminum foil were coated with a silicone rubber primer (commercial name No. 16T: Shin-Etsu Chemical Co., Ltd.) and heated at 150° C. for 10 minutes.

The aforesaid coating solution was then coated onto this aluminum foil using a knife coater, and the solvent was removed in an air-heating furnace at 80° C. A silicone rubber layer was formed on the reverse side by a similar process.

This uncured sheet was cut into a 300 mm square, and pressed at a temperature of 170° C. under a load of 60 kg/cm² for 10 minutes to cure the graphite powder-containing silicone layer. It was then heated again in a oven at 200° C. for 1 hour so as to obtain a sheet of thickness 0.2 mm.

The thermal impedance of this sheet was measured and found to be 2.93° C./W.

The thermal impedance was measured according to the following method.

MEASUREMENT OF THERMAL IMPEDANCE

A thermally conductive sheet was interposed between a transistor (commercial name 2SD1487: Matsushita Denshi Kogyo K. K.) and a heat sink (commercial name FBA-150-PS: Hounetsuki no Oh-esu K. K), and fixed by a 5 kg-cm torque.

The value of the thermal impedance was then measured by a transistor transient thermal impedance meter (commercial name TH-156: Kuwano Denki K. K.) one minute after applying a D.C. current of 3 A at a voltage of 10 V.

$$\text{The thermal impedance (°C/W)} = \frac{(\Delta VBS/C)}{10(V) \times 3(A) + \alpha}$$

In this formula, $\Delta VBS$ is $\Delta VB$ (mV) when the sheet is interposed between the transistor and heat sink, C. is the temperature coefficient of $\Delta VEB$ for the transistor ($\Delta VEB/\Delta T = 2.2$ mV/°C.), $\alpha$ is a term for applying a correction by a base current (=0.9 W), A is amperes, V is volts and W is watts.

EXAMPLE 2

A sheet of thickness 0.2 mm was prepared by an identical procedure to that of Example 1 except for the use of 80 parts by weight of an organopolysiloxane comprising 99.85 mole % of dimethylsiloxane and 0.15 mole % of methylvinylsiloxane of average degree of polymerization 8,000, and 20 parts by weight of an adhesion-conferring organopolysiloxane having a mole ratio of $SiO_2$ units to $(CH_3)_3 SiO_{0.5}$ units equal to 1:0.7 and containing 0.01 mole of vinyl groups per 100 g.

This sheet was adhesive, and could be fixed to the vertical surface of the transistor. The thermal impedance was measured and found to be 2.85° C./W.

COMPARATIVE EXAMPLE

The thermal impedance of thermally conductive grease (commercial name G-746: Shin-Etsu Chemical Co., Ltd.), and of a thermally conductive sheet of thickness 0.2 mm consisting of a layer of silicone rubber containing boron nitride applied to both surfaces of a glass cloth (commercial name TC-20 BG: Shin-Etsu Chemical Co., Ltd.), were measured. They were found to be 2.80° and 3.46° C./W respectively.

From the above results, it was concluded that the thermal impedance of the thermally conductive sheet of the present invention was as good as that of thermally conductive grease.

What is claimed:

1. A thermally conductive sheet comprising a metal foil having a thickness of 1-300 μm, of which at least one side is coated with a silicone rubber layer containing graphite powder, wherein the silicone rubber layer containing graphite powder is formed by adding 60-400 parts by weight of graphite powder to 100 parts by weight of silicone rubber, and is an organopolysiloxane represented by the general formula $R_a SiO_{(4-a)/2}$ where R is an organic group, and a is a number in the range 1.98-2.02.

2. A thermally conductive sheet as defined in claim 1 wherein the graphite powder has a particle size ranging from 1 to 100 μm.

3. A thermally conductive sheet as defined in claim 1 wherein R is an organic group selected from a group consisting of methyl, vinyl, phenyl and trifluoropropyl groups.

4. A thermally conductive sheet as defined in claim 1 wherein the silicone rubber has viscosity of at least 1,000 cs at 25° C.

5. A thermally conductive sheet as defined in claim 1 wherein the silicone rubber layer is cured through a radical reaction.

6. A thermally conductive sheet as defined in claim 5 wherein the curing agent used is an organic peroxide.

7. A thermally conductive sheet as defined in claim 1 wherein the silicone rubber layer is cured through an addition reaction.

8. A thermally conductive sheet as defined in claim 7 wherein the curing agent used is a substance consisting essentially of an organohydrogenpolysiloxane having at least two hydrogen atoms bonded to a silicon atom in one molecule and a platinum catalyst.

9. A thermally conductive sheet as defined in claim 1 wherein 10–50 parts by weight per 100 parts by weight silicone rubber in the silicone rubber layer is replaced by an adhesion-conferring organopolysiloxane.

10. A thermally conductive sheet as defined in claim 9 wherein the adhesion-conferring organopolysiloxane is an organopolysiloxane wherein the mole ration of $SiO_2$ units to $R'_3 SiO_{0.5}$ units in the molecule is equal to 1:0.4–1:1.5, where R' is a hydrogen atom or an organic group.

11. A thermally conductive sheet as defined in claim 10 wherein R' is a hydrogen atom or an organic group selected from a group consisting of methyl, vinyl and phenyl groups.

12. A thermally conductive sheet as defined in claim 1 wherein the silicone rubber layer additionally contains at least either a reinforcing silica or a heat resistance-improving agent.

13. A thermally conductive sheet as defined in claim 1 wherein the metal foil is made of a material selected from a group consisting of aluminum, copper, iron, nickel, tin, zinc, stainless steel, brass and monel.

* * * * *